United States Patent
Wang et al.

(10) Patent No.: US 6,228,759 B1
(45) Date of Patent: May 8, 2001

(54) METHOD OF FORMING AN ALLOY PRECIPITATE TO SURROUND INTERCONNECT TO MINIMIZE ELECTROMIGRATION

(75) Inventors: Pin-Chin C. Wang, Menlo Park; Christy M. Woo, Cupertino; Sergey Lopatin, Santa Clara, all of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/561,622

(22) Filed: May 2, 2000

(51) Int. Cl.$^7$ .................................................. H01L 21/4763
(52) U.S. Cl. ..................... 438/625; 438/626; 438/627; 438/629; 438/633; 438/640; 438/643; 438/645; 438/648; 438/660; 438/687
(58) Field of Search ....................................... 438/625, 626, 438/627, 629, 633, 640, 643, 645, 648, 660, 687

(56) References Cited

U.S. PATENT DOCUMENTS

| | | | |
|---|---|---|---|
| 5,891,513 | * 4/1999 | Dubin et al. | 427/98 |
| 6,126,806 | * 10/2000 | Uzoh | 205/182 |
| 6,130,156 | * 10/2000 | Havemann et al. | 438/637 |
| 6,136,707 | * 10/2000 | Cohen | 438/687 |

* cited by examiner

Primary Examiner—John F. Niebling
Assistant Examiner—Lynne A. Gurley
(74) Attorney, Agent, or Firm—Monica H. Choi

(57) ABSTRACT

An alloy precipitate is formed to surround a conductive fill within an interconnect opening, including especially a top surface of the conductive fill, to prevent drift of material from the conductive fill into the insulating layer that is surrounding the interconnect opening. An alloy material is deposited non-conformally such that the alloy material is deposited substantially only toward a top of the sidewalls of an interconnect opening and substantially only toward a center of the bottom wall of the interconnect opening. The interconnect opening is filled with the conductive material by growing the conductive material from a seed layer of the conductive material to form a conductive fill of the conductive material within the interconnect opening. The semiconductor wafer is heated to anneal the conductive fill within the interconnect opening such that the conductive fill forms into a substantially single grain structure. During the thermal anneal, reactant within the alloy material migrates along a top surface of the conductive fill and along a grain boundary of the conductive fill. An alloy precipitate is formed from a reaction between the reactant and the conductive material at the top surface and at the grain boundary of the conductive fill when the semiconductor wafer is then cooled down. The alloy precipitate at the top surface and at the grain boundary of the conductive fill prevents drift of the conductive material along the top surface and along the grain boundary of the conductive fill and into the insulating layer surrounding the interconnect opening.

14 Claims, 6 Drawing Sheets

METHOD OF FORMING AN ALLOY PRECIPITATE TO SURROUND INTERCONNECT TO MINIMIZE ELECTROMIGRATION

TECHNICAL FIELD

The present invention relates generally to fabrication of interconnects within integrated circuits, and more particularly, to formation of an alloy precipitate to surround an interconnect including especially the top surface of the interconnect, such as copper interconnect for example, to effectively encapsulate the interconnect for preventing material comprising the interconnect from drifting into surrounding insulating material.

BACKGROUND OF THE INVENTION

A long-recognized important objective in the constant advancement of monolithic IC (Integrated Circuit) technology is the scaling-down of IC dimensions. Such scaling-down of IC dimensions reduces area capacitance and is critical to obtaining higher speed performance of integrated circuits. Moreover, reducing the area of an IC die leads to higher yield in IC fabrication. Such advantages are a driving force to constantly scale down IC dimensions.

Thus far, aluminum has been prevalently used for metallization within integrated circuits. However, as the width of metal lines are scaled down to smaller submicron and even nanometer dimensions, aluminum metallization shows electromigration failure. Electromigration failure, which may lead to open and shorted metal lines, is now a commonly recognized problem. Moreover, as dimensions of metal lines further decrease, metal line resistance increases substantially, and this increase in line resistance may adversely affect circuit performance.

Given the concerns of electromigration and line resistance with smaller metal lines and vias, copper is considered a more viable metal for smaller metallization dimensions. Copper has lower bulk resistivity and potentially higher electromigration tolerance than aluminum. Both the lower bulk resistivity and the higher electromigration tolerance improve circuit performance.

Referring to FIG. 1, a cross sectional view is shown of a copper interconnect 102 within a trench 104 formed in an insulating layer 106. The copper interconnect 102 within the insulating layer 106 is formed on a semiconductor substrate 108 such as a silicon substrate as part of an integrated circuit. Because copper is not a volatile metal, copper cannot be easily etched away in a deposition and etching process as typically used for aluminum metallization. Thus, the copper interconnect 102 is typically formed by etching the trench 104 as an opening within the insulating layer 106, and the trench 104 is then filled with copper typically by an electroplating process, as known to one of ordinary skill in the art of integrated circuit fabrication.

Unfortunately, copper is a mid-bandgap impurity in silicon and silicon dioxide. Thus, copper may diffuse easily into these common integrated circuit materials. Referring to FIG. 1, the insulating layer 106 may be comprised of silicon dioxide or a low dielectric constant insulating material such as organic doped silica, as known to one of ordinary skill in the art of integrated circuit fabrication. Copper may easily diffuse into such an insulating layer 106, and this diffusion of copper may degrade the performance of the integrated circuit. Thus, a diffusion barrier material 110 is deposited to surround the copper interconnect 102 within the insulating layer 106 on the sidewalls and the bottom wall of the copper interconnect 102, as known to one of ordinary skill in the art of integrated circuit fabrication. The diffusion barrier material 110 is disposed between the copper interconnect 102 and the insulating layer 106 for preventing diffusion of copper from the copper interconnect 102 to the insulating layer 106 to preserve the integrity of the insulating layer 106.

Further referring to FIG. 1, an encapsulating layer 112 is deposited as a passivation layer to encapsulate the copper interconnect 102, as known to one of ordinary skill in the art of integrated circuit fabrication. The encapsulating layer 112 is typically comprised of a dielectric such as silicon nitride, and copper from the copper interconnect 102 does not easily diffuse into such a dielectric of the encapsulating layer 112.

Referring to FIG. 1, in the prior art, the encapsulating layer 112 of silicon nitride is deposited directly onto an exposed surface of the copper interconnect 102 and the surrounding insulating layer 106 after the exposed surface of the copper interconnect 102 and the surrounding insulating layer 106 are polished to a level surface. Unfortunately, the silicon nitride of the encapsulating layer 112 does not bond well to the copper at the exposed surface of the copper interconnect 102.

Thus, although copper does not diffuse easily through the encapsulating layer 112 of silicon nitride, copper from the copper interconnect 102 laterally drifts from the interface between the copper interconnect 102 and the encapsulating layer 112 of silicon nitride along the bottom surface 114 of the encapsulating layer 112 of silicon nitride because of the weak bonding of the copper interconnect 102 and the encapsulating layer 112 of silicon nitride. In addition, copper from the grain boundaries of the copper interconnect 112 at the interface between the copper interconnect 112 and the diffusion barrier material 110 also drifts along such an interface and then along the interface between the copper interconnect 102 and the encapsulating layer 112 of silicon nitride.

The copper that laterally drifts from the interface between the copper interconnect 102 and the encapsulating layer 112 of silicon nitride along the bottom surface 114 of the encapsulating layer 112 eventually diffuses into the insulating layer 106 to disadvantageously degrade the insulating property of the insulating layer 106. Nevertheless, use of copper metallization is desirable for further scaling down integrated circuit dimensions because of the lower bulk resistivity and the higher electromigration tolerance. Thus, a mechanism is desired for preventing the drift of copper from the copper interconnect 102 into the insulating layer 106.

SUMMARY OF THE INVENTION

Accordingly, in a general aspect of the present invention, an alloy precipitate is formed to surround a conductive fill, such as copper, within an interconnect opening, including especially a top surface of the conductive fill, to prevent drift of material from the conductive fill along the top surface and grain boundaries of the conductive fill and into the insulating layer that is surrounding the interconnect opening.

In one embodiment of the present invention, an interconnect opening of an integrated circuit is formed within an insulating layer on a semiconductor wafer. A seed layer of a conductive material is deposited conformally onto sidewalls and a bottom wall of the interconnect opening. An alloy material is also deposited non-conformally such that the alloy material is deposited substantially only toward a top of the sidewalls of the interconnect opening and substantially only toward a center of the bottom wall of the interconnect opening. The interconnect opening is filled with the conductive material by growing the conductive material from the seed layer of the conductive material to form a conductive fill of the conductive material within the interconnect opening. The semiconductor wafer is heated to anneal the conductive fill within the interconnect opening such that the conductive fill forms into a substantially single grain structure. The seed layer of the conductive material anneals into the substantially single grain structure of the conductive fill.

A reactant within the alloy material migrates along a top surface of the conductive fill and along a grain boundary of the conductive fill when the semiconductor wafer is heated. An alloy precipitate forms from a reaction between the reactant and the conductive material at the top surface and the grain boundary of the conductive fill when the semiconductor wafer is then cooled down. The alloy precipitate at the top surface and the grain boundary of the conductive fill prevents drift of the conductive material along the top surface and the grain boundary of the conductive fill and into the insulating layer surrounding the interconnect opening.

A capping layer may be deposited over the interconnect opening. In that case, the alloy precipitate at the top surface of the conductive fill prevents drift of the conductive material from the conductive fill along a bottom surface of the capping layer and into the insulating layer surrounding the interconnect opening.

The present invention may be used to particular advantage when the conductive material is copper, the insulating layer surrounding the interconnect opening is comprised of silicon dioxide ($SiO_2$) or a low dielectric constant insulating material such as organic doped silica, and the capping layer is comprised of silicon nitride (SiN).

These and other features and advantages of the present invention will be better understood by considering the following detailed description of the invention which is presented with the attached drawings.

BRIEF DESCRIPTION OF THE DRAWINGS

The figures referred to herein are drawn for clarity of illustration and are not necessarily drawn to scale. Elements having the same reference number in FIGS. 1, 2, 3, 4, 5, 6, 7, 8, 9, 10, 11, 12, 13, 14, and 15 refer to elements having similar structure and function.

DETAILED DESCRIPTION

The present invention is described for formation of copper interconnect. However, the present invention may be practiced for preventing drift of material from other types of interconnects into the surrounding insulating layer, as would be apparent to one of ordinary skill in the art of integrated circuit fabrication from the description herein.

Figure 1:
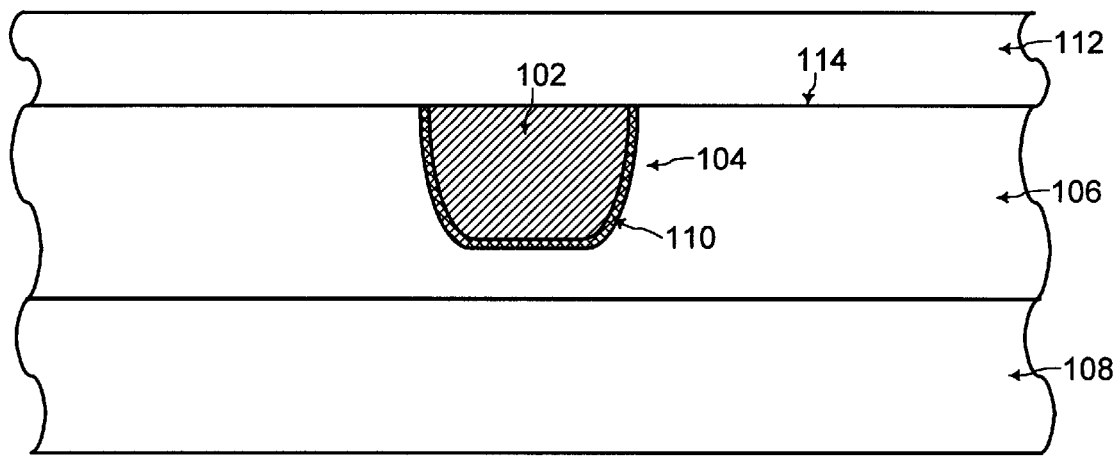
FIG. 1 shows a cross-sectional view of a copper interconnect formed by copper filling a trench within an insulating layer, according to the prior art.
Figure 2:
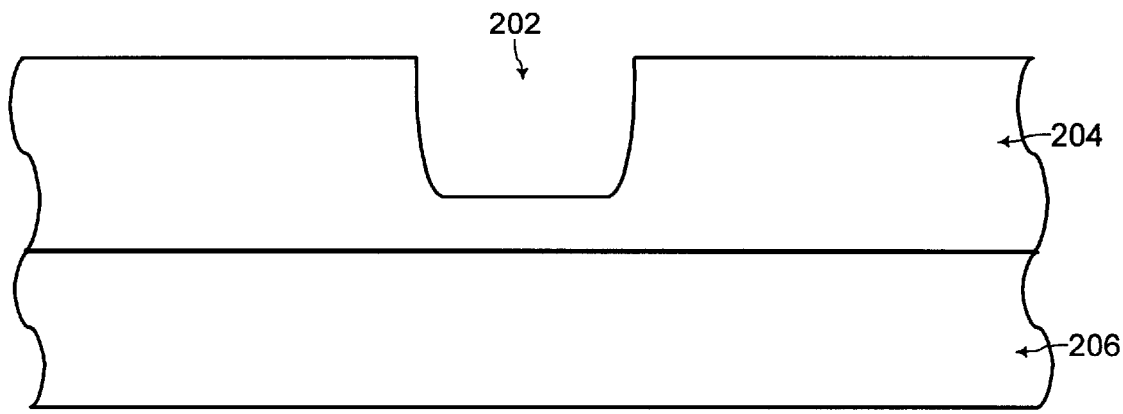
FIGS. 2, 3, 4, 5, 6, 7, 8, 9, 10, and 11 show cross-sectional views of an interconnect to illustrate process steps for forming an alloy precipitate that surrounds a conductive fill within an interconnect opening to prevent drift of material of the conductive fill into an insulating layer surrounding the interconnect opening, with deposition of a seed layer before deposition of an alloy material according to one embodiment of the present invention.

Referring to FIG. 2, for forming an interconnect such as copper interconnect, an interconnect opening 202 such as a trench line or a via hole is formed within an insulating layer 204 on a semiconductor substrate 206 as part of an integrated circuit, as known to one of ordinary skill in the art of integrated circuit fabrication. Typically, the semiconductor substrate 206 is comprised of silicon (Si), and the insulating layer 204 is comprised of silicon dioxide ($SiO_2$) or a low dielectric constant insulating material such as organic doped silica, as known to one of ordinary skill in the art of integrated circuit fabrication.

Copper interconnect is desirable for metallization within an integrated circuit with scaled down dimensions because copper has lower bulk resistivity and potentially higher electromigration tolerance than aluminum. However, because copper is not a volatile metal, copper cannot be easily etched away in a deposition and etching process as typically used for aluminum metallization. Thus, copper interconnect is typically formed by etching the interconnect opening 202 within the insulating layer 204 and then filling the interconnect opening 202 with copper fill.

Figure 3:
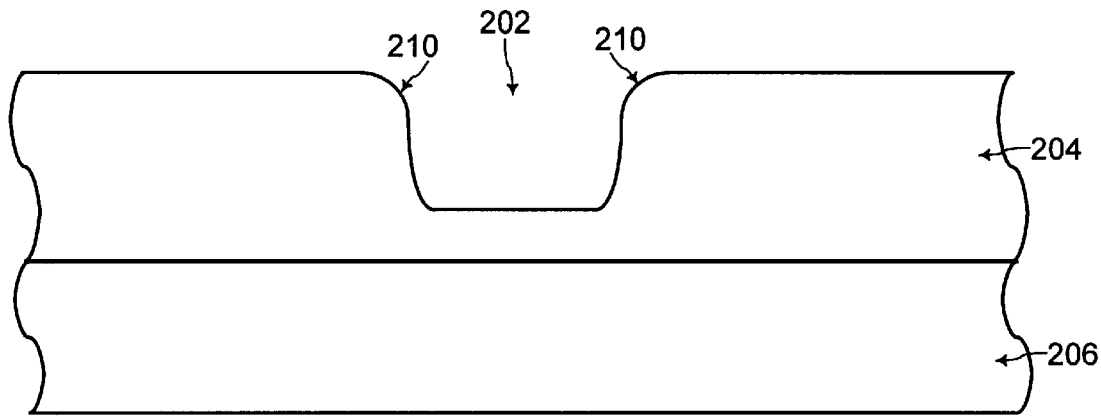

Referring to FIG. 3, the top corner 210 of the interconnect opening 202 is rounded by a sputtering process. Sputtering processes are known to one of ordinary skill in the art of integrated circuit fabrication.

Figure 4:
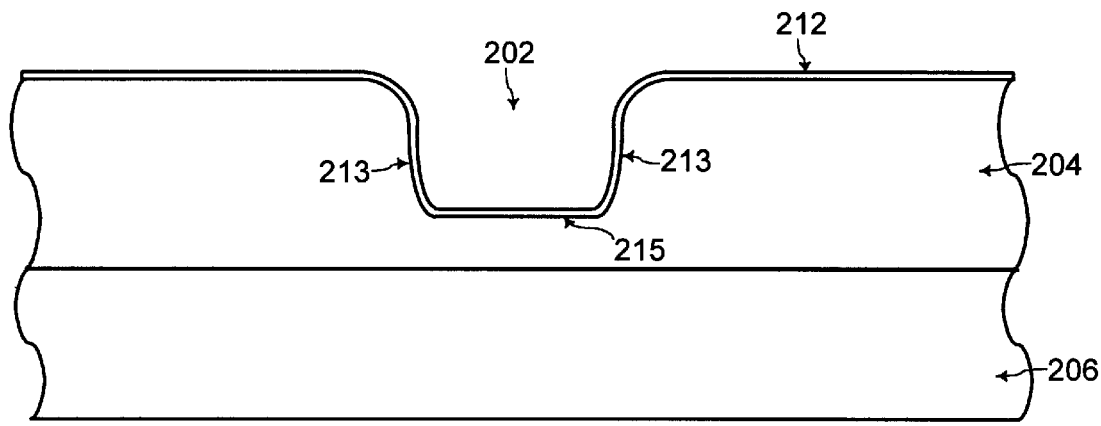

Referring to FIG. 4, a diffusion barrier layer 212 is deposited on the exposed surfaces of the insulating layer 204 including the sidewalls 213 and the bottom wall 215 of the interconnect opening 202. The diffusion barrier layer 212 is comprised of a diffusion barrier material that prevents diffusion of copper to be filled within the interconnect opening 202 into the surrounding insulating layer 204. Such diffusion barrier materials and processes for deposition of such diffusion barrier materials are known to one of ordinary skill in the art of integrated circuit fabrication.

Unfortunately, copper is a mid-bandgap impurity in silicon and silicon dioxide. Thus, copper may diffuse easily into these common integrated circuit materials. Referring to FIG. 2, the insulating layer 204 is typically comprised of silicon dioxide or a low dielectric constant insulating material such as organic doped silica, as known to one of ordinary skill in the art of integrated circuit fabrication, especially when the semiconductor substrate 206 is a silicon substrate.

Copper may easily diffuse into the insulating layer 204, and this diffusion of copper may degrade the performance of the integrated circuit. Thus, the first diffusion barrier layer 212 is deposited to surround the copper to be filled within the interconnect opening 202. The diffusion barrier layer 212 prevents diffusion of copper to filled within the interconnect opening 202 to the insulating layer 204 to preserve the integrity of the insulating layer 204.

Figure 5:
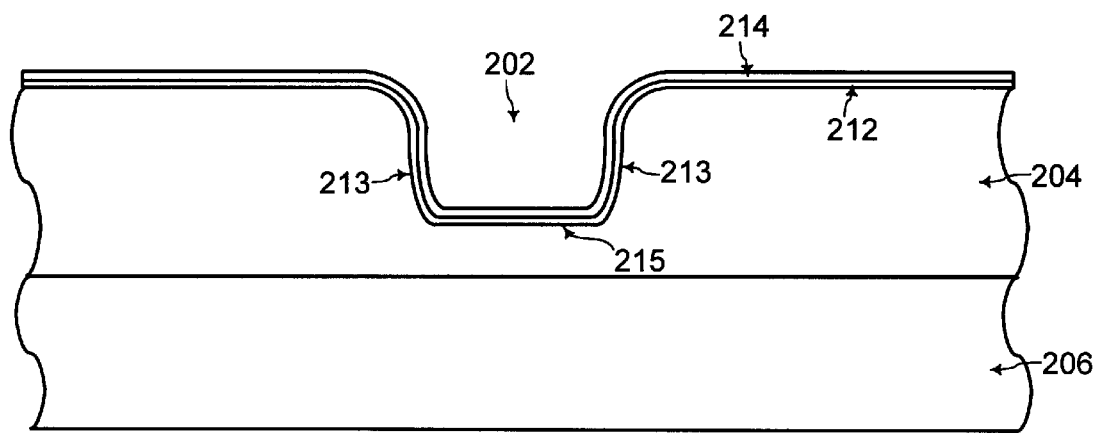

Referring to FIG. 5, a copper seed layer 214 is conformally deposited on the diffusion barrier layer 212. Processes for conformal deposition of the copper seed layer 214, such as CVD (chemical vapor deposition), IMP (ionized metal plasma) deposition, and continuous PVD (physical vapor deposition), are known to one of ordinary skill in the art of integrated circuit fabrication.

Figure 6:
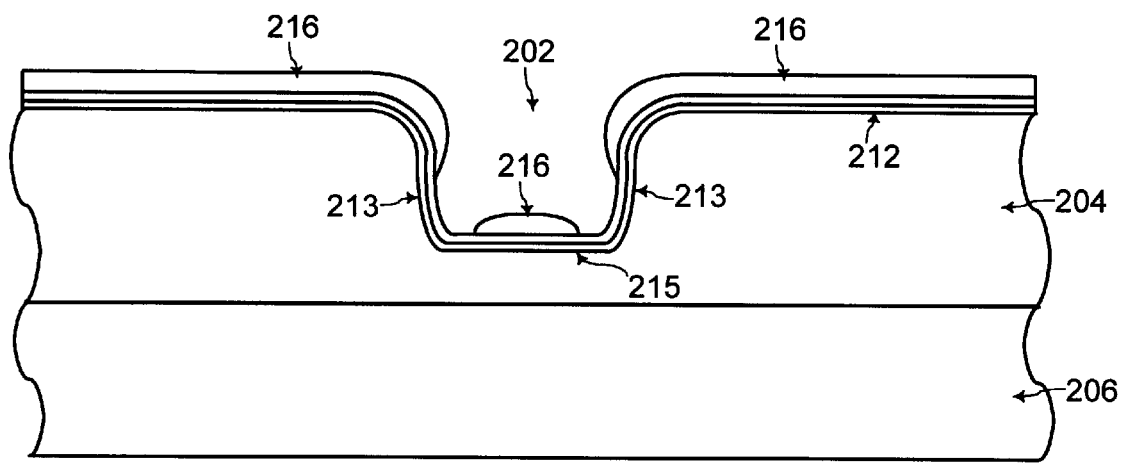

Referring to FIG. 6, a copper alloy material 216 is deposited non-conformally on the copper seed layer 214. Processes for non-conformal deposition of material, such as non-conformal PVD (physical vapor deposition), are known to one of ordinary skill in the art of integrated circuit fabrication.

With non-conformal deposition, the copper alloy material 216 is deposited substantially only toward a top of the sidewalls 213 of the interconnect opening 202 and substantially only toward a center of the bottom wall 215 of the interconnect opening 202. The copper alloy material 216 may be comprised of an intermetallic material of copper tin ($Cu_xSn_y$) or copper zirconium ($Cu_zZr_t$). The tin and zirconium has low solid solubility in the copper of the intermetallic copper alloy material 216.

The intermetallic copper alloy material 216 of copper tin ($Cu_xSn_y$) or copper zirconium ($Cu_zZr_t$) may be deposited by a non-conformal PVD (physical vapor deposition) process. In an example PVD (physical vapor deposition) process, a target of copper tin ($Cu_xSn_y$) or copper zirconium ($Cu_zZr_t$) is sputtered by argon ions. In one embodiment of the present invention, such a target is comprised of high purity copper with 0.1% to 4% alloy element of tin or zirconium.

The DC power used for sputtering the target of copper tin ($Cu_xSn_y$) or copper zirconium ($Cu_zZr_t$) is in a range of from about 1 KW (kilowatt) to about 4 KW (kilowatt). The deposition time is about 2–10 seconds. The pressure within the reaction chamber of the PVD (physical vapor deposition) system is about 2–10 milliTorr. With these conditions, the thickness of the copper alloy material 216 is about 200 Å (angstroms) to 1000 Å (angstroms). PVD (physical vapor deposition) systems are known to one of ordinary skill in the art of integrated circuit fabrication.

Figure 7:
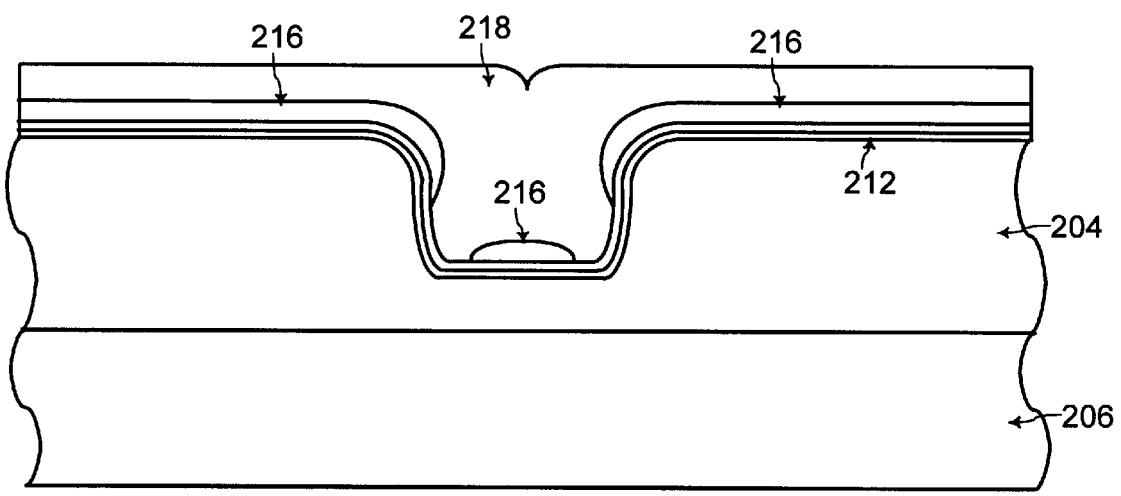

Referring to FIG. 7, the interconnect opening 202 is filled with a conductive material such as copper to form a conductive fill 218 of the conductive material typically by an electroplating process. Electroplating processes for filling the interconnect opening 202 with conductive fill 218 are known to one of ordinary skill in the art of integrated circuit fabrication.

Figure 8:
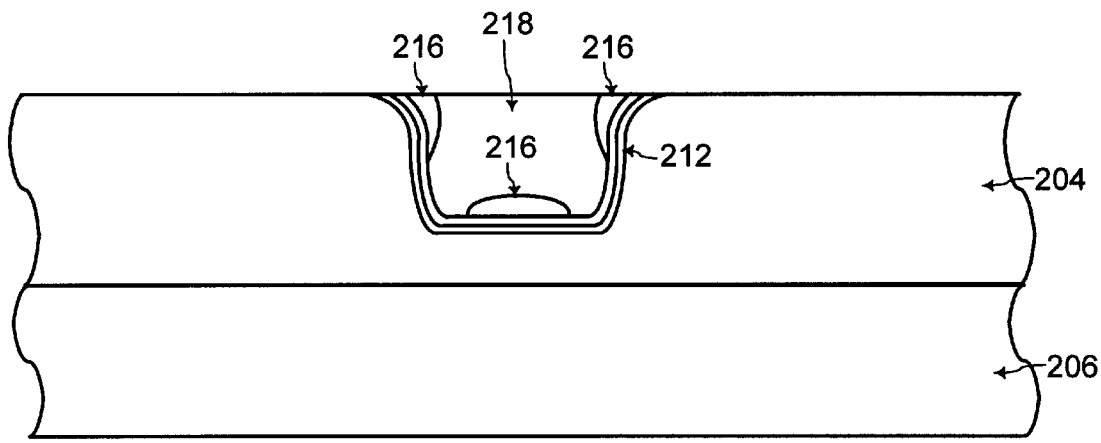

Referring to FIG. 8, the top surface of the structures on the semiconductor wafer 206 is polished down typically using a CMP (Chemical Mechanical Polishing) process. With such a polishing process, the first diffusion barrier layer 212, the copper alloy material 216, and the copper conductive fill 218 are confined within the interconnect opening 202. In addition, after the polishing process, the alloy material 216 is exposed at the top of the interconnect opening 202. CMP processes are known to one of ordinary skill in the art of integrated circuit fabrication.

In one embodiment of the present invention, before the polishing of the top surface of the structures on the semiconductor wafer 206, a thermal anneal is performed at a relatively low temperature in a range of from about 100° Celsius to about 250° Celsius for a time period in a range of from about 10 minutes to about 1 hour. Thermal anneal processes are known to one of ordinary skill in the art of integrated circuit fabrication.

Such a relatively low temperature thermal anneal before the polishing process is advantageous for strengthening the crystal structure of the conductive fill 218 before the CMP (Chemical Mechanical Polishing) process such that damage to the conductive fill 218 during the CMP (Chemical Mechanical Polishing) process is minimized. In addition, such a relatively low temperature thermal anneal before the polishing process is advantageous for increasing the density of the conductive fill 218 such that shrinkage of the conductive fill 218 during a latter relatively high temperature thermal anneal is minimized.

Figure 9:
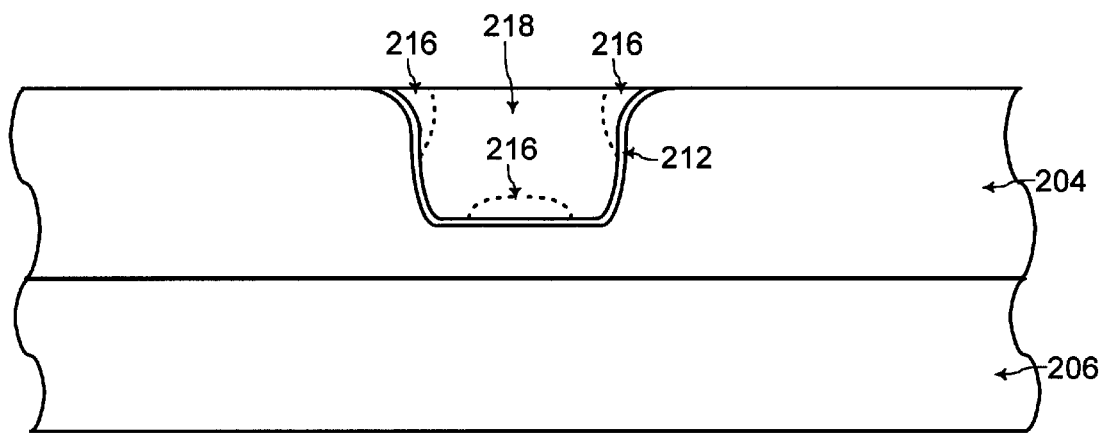

Referring to FIG. 9, another thermal anneal is performed at a relatively high temperature above about 250° Celsius for a time period in a range of from about 10 minutes to about 1 hour after polishing of the semiconductor wafer. With such heating of the semiconductor wafer 206, the copper conductive fill 218 forms into a substantially single grain structure, and the seed layer 214 anneals into the substantially single grain structure of the conductive fill 218. Furthermore, the copper alloy material 216 also anneals into the substantially single grain structure of the conductive fill 218. The single grain structure of the conductive fill 218 minimizes resistance of the interconnect such that performance of the integrated circuit having the interconnect of the present invention is enhanced, as known to one of ordinary skill in the art of integrated circuits.

Figure 10:
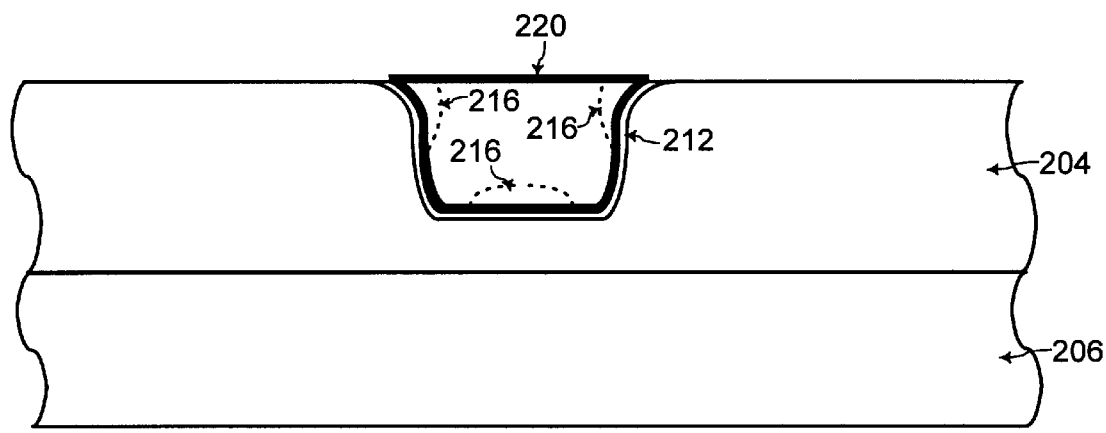

Furthermore, during the relatively high temperature anneal, referring to FIG. 10, the dopant impurity of the alloy material 216 is a reactant that migrates along the top surface of the conductive fill 218 and along the grain boundaries of the conductive fill 218 at the interface between the conductive fill 218 and the diffusion barrier layer 212. During a cool down of the semiconductor wafer after the high temperature anneal, such a reactant reacts with the conductive material such as copper of the copper conductive fill 218 to form an alloy precipitate 220 at the top surface and at the grain boundaries of the conductive fill 218. In a preferred embodiment of the present invention, a relatively slow cool down process spanning a time period of about one hour is used for cooling down the semiconductor wafer from the relatively high temperature of the anneal to room temperature.

For example, when the alloy material 216 is comprised of an intermetallic material of copper tin ($Cu_xSn_y$), the reactant is tin (Sn) from the alloy material 216 that migrates along the top surface of the conductive fill 218 and along the grain boundaries of the conductive fill 218 to form a copper tin alloy precipitate 220 at the top surface and at the grain boundaries of the conductive fill 218. The alloy precipitate 220 that is comprised of copper tin prevents copper of the conductive fill 218 from drifting along the top surface and along the grain boundaries of the conductive fill 218.

Similarly, when the alloy material 216 is comprised of an intermetallic material of copper zirconium ($Cu_zZr_t$), the reactant is zirconium (Zr) from the alloy material 216 that migrates along the top surface of the conductive fill 218 and along the grain boundaries of the conductive fill 218 to form a copper zirconium alloy precipitate 220 at the top surface and at the grain boundaries of the conductive fill 218. The alloy precipitate 220 that is comprised of copper zirconium prevents copper of the conductive fill 218 from drifting along the top surface and along the grain boundaries of the conductive fill 218.

When the alloy material 216 is comprised of copper, the reactant within the alloy material 216 such as tin or zirconium preferably has a low solid solubility in copper such that the reactant easily migrates out from the alloy material 216 along the top surface and along the grain boundaries of the conductive fill 218 during the relatively high temperature thermal anneal process.

In addition, referring to FIGS. 9 and 10, since the alloy material 216 at the sidewalls of the interconnect opening 202 is exposed at the top of the interconnect opening 202 during the relatively high temperature thermal anneal process, the reactant is further ensured to migrate along the top surface of the conductive fill 218 such that the alloy precipitate 220 forms at the top surface of the conductive fill 218. Thus, referring to FIGS. 6, 9, and 10, the non-conformal PVD (physical vapor deposition) process is preferably desired for deposition of the alloy material 216 toward the top corners of the interconnect opening 202.

Figure 11:
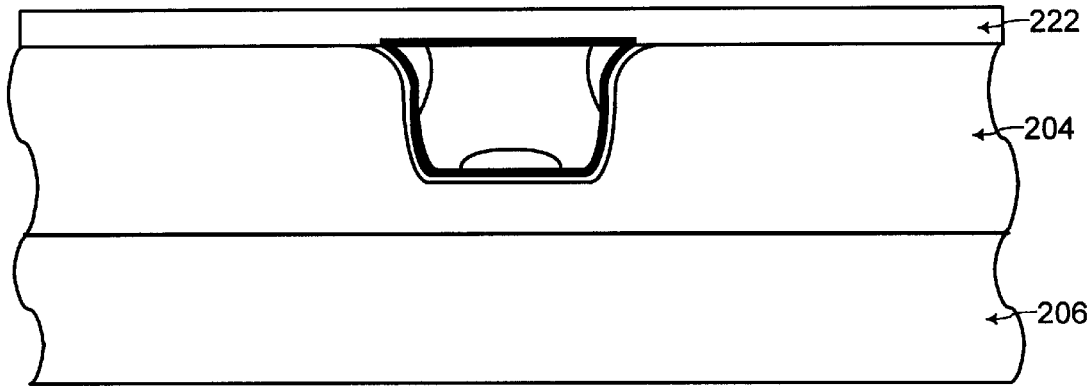

In this manner, by forming the alloy precipitate 220 that surrounds the conductive fill 218 within the interconnect opening 202, drift of the conductive material of the conductive fill 218 such as copper along the top surface and the grain boundaries of the conductive fill 218 is minimized. Referring to FIG. 11, a capping layer 222 is formed to cover the conductive fill 218 as a passivation layer for protection of the interconnect. The capping layer 222 is typically comprised of silicon nitride (SiN).

Although copper does not easily diffuse through the capping layer 222 of silicon nitride (SiN), copper may drift along the bottom surface of the capping layer 222 and into the surrounding insulating layer 204. With formation of the alloy precipitate 220 that surrounds the conductive fill 218 and especially at the top surface of the conductive fill 218, drift of copper along the bottom surface of the capping layer 222 and into the surrounding insulating layer 204 is minimized to preserve the integrity of the surrounding insulating layer 204. In addition, the conductive fill 218 is annealed into a substantially single grain structure, and the copper alloy material 216 also substantially anneals into the single grain structure of the conductive fill 218 such that the resistivity of the interconnect structure within the interconnect opening 202 is minimized.

In FIGS. 4, 5, 6, 7, 8, 9, 10, and 11, the seed layer 214 is conformally deposited before the alloy material 216 is non-conformally deposited, according to one embodiment of the present invention. Referring to FIGS. 6 and 7, an advantage of non-conformally depositing the alloy material 216 after conformally depositing the seed layer 214 is that during the electroplating of the copper conductive fill 218 from the seed layer 214, the copper conductive fill initially grows more rapidly from the bottom corners of the interconnect opening 202.

With the more rapid growth of copper conductive fill from the bottom corners of the interconnect opening 202, formation of voids within the conductive fill 218 is minimized. Minimization of voids within the conductive fill 218 is advantageous for further minimizing electromigration failure of the interconnect, as known to one of ordinary skill in the art of integrated circuit fabrication.

Additionally, referring to FIGS. 2 and 3, sputtering the insulating material of the insulating layer 204 at the top corner 210 of the interconnect opening 202 to round the top corner 210 of the interconnect opening 202 is advantageous for maximizing the size of the top of the interconnect opening 202. With a larger size of the top of the interconnect opening 202, non-conformal deposition of the alloy material 216 toward the top corner 210 of the interconnect opening 202 does not substantially reduce the size of the top of the interconnect opening 202. Maximizing the size of the top of the interconnect opening 202 further ensures that the interconnect opening 202 is not prematurely closed off during the electroplating process of filling the interconnect opening 202 with copper such that formation of voids within the conductive fill 218 is minimized.

Figure 12:
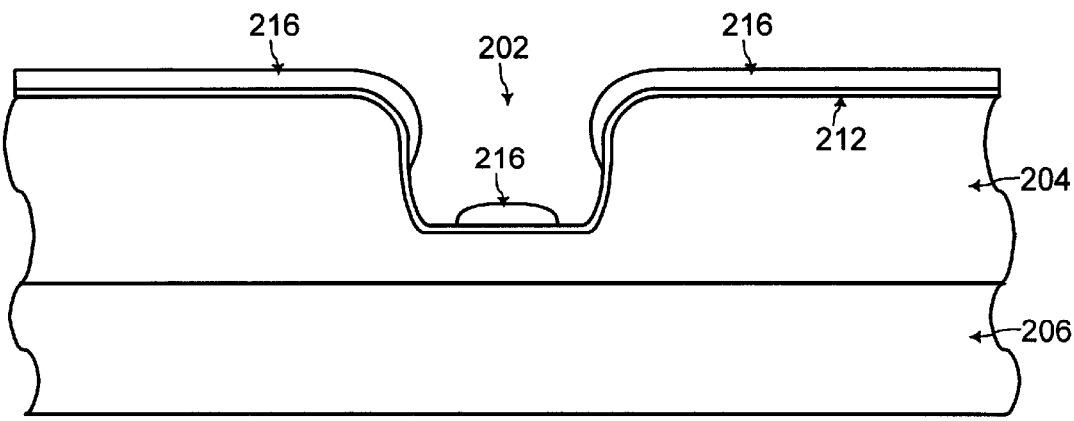
FIGS. 12, 13, 14, and 15 show cross-sectional views of an interconnect to illustrate process steps for forming an alloy precipitate that surrounds a conductive fill within an interconnect opening to prevent drift of material of the conductive fill into an insulating layer surrounding the interconnect opening, with deposition of the seed layer after deposition of the alloy material according to another embodiment of the present invention.
Figure 13:
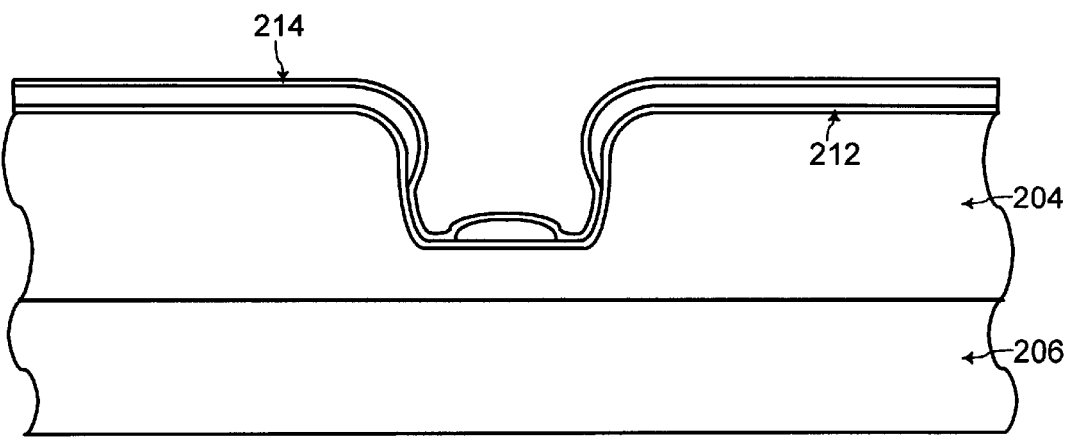

Referring to FIGS. 12, 13, 14, and 15, the present invention may also be advantageously practiced when the alloy material 216 is non-conformally deposited before the seed layer 214 is conformally deposited, according to another embodiment of the present invention. Referring to FIG. 12, the alloy material 216 is non-conformally deposited on the diffusion barrier layer 212. Referring to FIG. 13, the seed layer 214 is then conformally deposited on the alloy material 216 after the non-conformal deposition of the alloy material 216.

Figure 14:
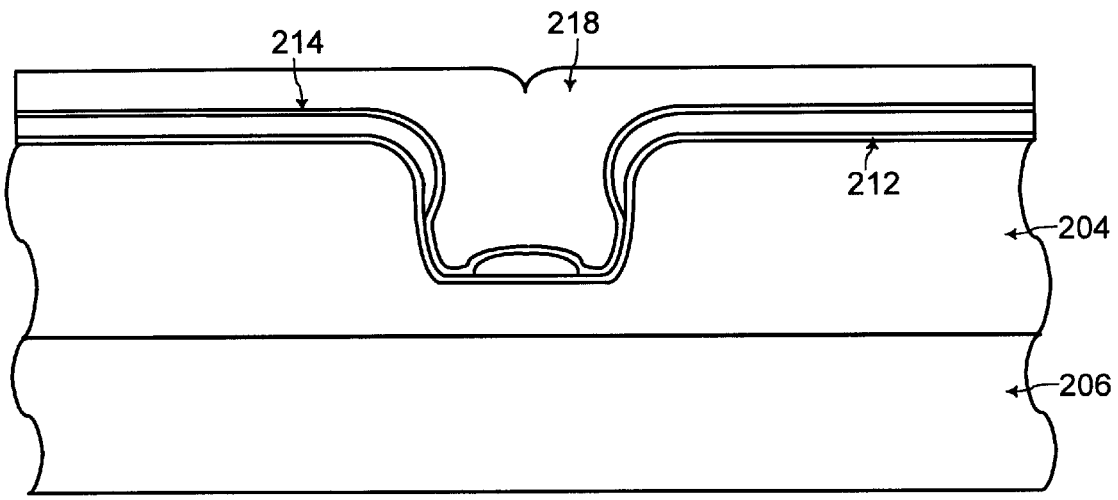

Referring to FIG. 14, the conductive fill 218 of conductive material such as copper is grown from the seed layer 214 typically by an electroplating process as known to one of ordinary skill in the art of integrated circuit fabrication. However, in this embodiment of the present invention, the copper fill 218 does not preferentially grow faster from the bottom corner of the interconnect opening 202.

In contrast, referring to FIG. 6, when the alloy material 216 is non-conformally deposited on to the seed layer 214 after the conformal deposition of the seed layer 214, the seed layer 214 is exposed substantially only at the bottom corner of the interconnect opening 202. Thus, referring to FIG. 7, the copper fill 218 preferentially grows faster from the bottom corner of the interconnect opening 202 where the seed layer 214 is exposed, and formation of voids within the copper fill 218 is advantageously minimized.

Figure 15:
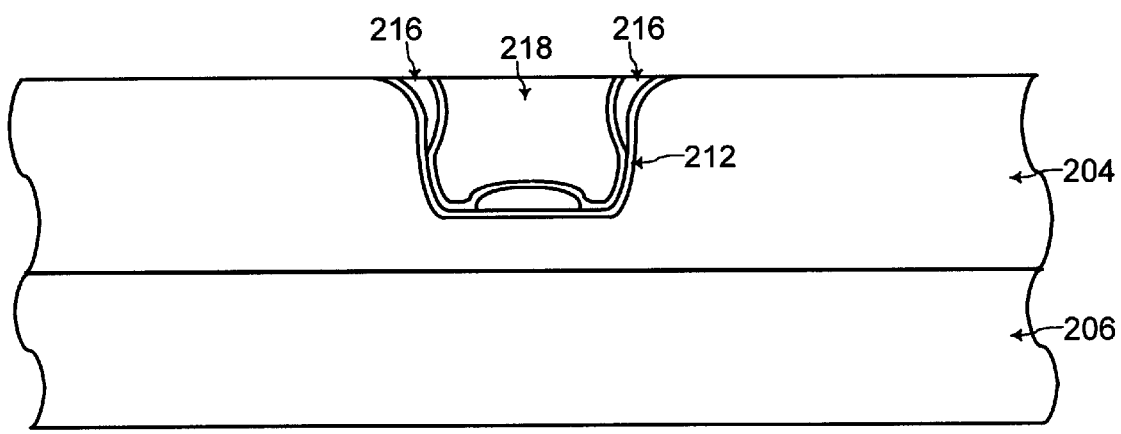

Nevertheless, referring to FIGS. 12, 13, and 14, the present invention may still be practiced when the alloy material 216 is non-conformally deposited before the seed layer 214 is conformally deposited. Referring to FIGS. 14 and 15, the top surface of the structures on the semiconductor wafer 206 is polished down typically using a CMP (Chemical Mechanical Polishing) process. With such a polishing process, the first diffusion barrier layer 212, the copper alloy material 216, and the copper conductive fill 218 are confined within the interconnect opening 202. Then, the semiconductor wafer 206 is heated in a relatively high temperature thermal anneal process such that the conductive fill 218 forms into a substantially single grain structure and such that the alloy precipitate 220 forms to surround the conductive fill 218, as similarly illustrated and described in reference to FIGS. 9 and 10.

The foregoing is by way of example only and is not intended to be limiting. For example, the present invention is described for formation of copper interconnect. However, the present invention may be practiced for preventing drift of material from other types of interconnects into the surrounding insulating layer, as would be apparent to one of ordinary skill in the art of integrated circuit fabrication from the description herein. Any material specified herein is by way of example only.

Furthermore, as will be understood by those skilled in the art, the structures described herein may be made or used in the same way regardless of their position and orientation. Accordingly, it is to be understood that terms and phrases such as "top," "bottom," and "sidewalls" as used herein refer to relative location and orientation of various portions of the structures with respect to one another, and are not intended to suggest that any particular absolute orientation with respect to external objects is necessary or required.

The present invention is limited only as defined in the following claims and equivalents thereof.

We claim:

1. A method for filling an interconnect opening of an integrated circuit, said interconnect opening being within an insulating layer on a semiconductor wafer, the method including the steps of:

A. depositing a seed layer of a conductive material conformally onto sidewalls and a bottom wall of said interconnect opening;

B. depositing an alloy material non-conformally such that said alloy material is deposited substantially only toward a top of said sidewalls of said interconnect opening and substantially only toward a center of said bottom wall of said interconnect opening and such that said alloy material is substantially not deposited on any bottom corner of said interconnect opening;

C. filling said interconnect opening with said conductive material by growing said conductive material from any exposed surface of said seed layer of said conductive material to form a conductive fill of said conductive material within said interconnect opening;

D. heating said semiconductor wafer to anneal said conductive fill within said interconnect opening such that said conductive fill forms into a substantially single grain structure, and wherein said seed layer of said conductive material anneals into said substantially single grain structure of said conductive fill;

wherein a reactant within said alloy material migrates along a top surface of said conductive fill and along a grain boundary of said conductive fill when said semiconductor wafer is heated; and E. forming an alloy precipitate from a reaction between said reactant and said conductive material on said top surface and at said grain boundary of said conductive fill when said semiconductor wafer is cooled down after said step D;

and wherein said alloy precipitate on said top surface and at said grain boundary of said conductive fill prevents drift of said conductive material along said top surface and said grain boundary of said conductive fill and into said insulating layer surrounding said interconnect opening.

2. The method of claim 1, wherein said step A of depositing said seed layer is performed before said step B of depositing said alloy material such that said alloy material is deposited on said seed layer.

3. The method of claim 1, wherein said step B of depositing said alloy material is performed before said step A of depositing said seed layer such that said seed layer is deposited on said alloy material.

4. The method of claim 1, further including the step of:
polishing said semiconductor wafer after said step C such that said alloy material and said conductive fill are contained within said interconnect opening;

wherein said alloy material toward said top of said sidewalls of said interconnect opening is exposed after polishing said semiconductor wafer.

5. The method of claim 4, wherein said step D of heating said semiconductor wafer includes a step of:

performing a first thermal anneal at a relatively high temperature above about 250° Celsius for a time period in a range of from about 10 minutes to about 1 hour after said step of polishing said semiconductor wafer.

6. The method of claim 5, further including a step of:

performing a second thermal anneal at a relatively low temperature in a range of from about 100° Celsius to about 250° Celsius for a time period in a range of from about 10 minutes to about 1 hour before said step of polishing said semiconductor wafer.

7. The method of claim 1, wherein said step B of non-conformally depositing said alloy material is performed with a PVD (physical vapor deposition) process.

8. The method of claim 1, further including the step of:

depositing a diffusion barrier layer on said sidewalls and said bottom wall of said interconnect opening before said step A and said step B, wherein said diffusion barrier layer prevents diffusion of said conductive material of said conductive fill into said insulating layer surrounding said interconnect opening.

9. The method of claim 1, wherein said conductive material is copper and wherein said insulating layer surrounding said interconnect opening is comprised of silicon dioxide ($SiO_2$).

10. The method of claim 1, further including the step of:

depositing a capping layer over said interconnect opening, wherein said alloy precipitate at said top surface of said conductive fill prevents drift of said conductive material from said conductive fill along a bottom surface of said capping layer and into said insulating layer surrounding said interconnect opening.

11. The method of claim 10, wherein said conductive material is copper, and wherein said insulating layer surrounding said interconnect opening is comprised of silicon dioxide ($SiO_2$), and wherein said capping layer is comprised of silicon nitride (SiN).

12. The method of claim 1, wherein said conductive material is copper, and wherein said alloy material is one of copper tin or copper zirconium.

13. The method of claim 1, further including the step of:

rounding a top corner of said interconnect opening by sputtering insulating material of said insulating layer at said top corner of said interconnect opening before depositing any material within said interconnect opening.

14. A method for filling an interconnect opening of an integrated circuit with copper, said interconnect opening being within an insulating layer of silicon dioxide ($SiO_2$) on a silicon semiconductor wafer, the method including the steps of:

A. rounding a top corner of said interconnect opening by sputtering silicon dioxide of said insulating layer at said top corner of said interconnect opening;

B. depositing a diffusion barrier layer on sidewalls and a bottom wall of said interconnect opening, wherein said diffusion barrier layer prevents diffusion of copper to be filled within said interconnect opening into said insulating layer surrounding said interconnect opening;

C. depositing a seed layer of copper conformally onto said diffusion barrier layer on said sidewalls and said bottom wall of said interconnect opening;

D. depositing an alloy material non-conformally such that said alloy material is deposited on said seed layer substantially only toward a top of said sidewalls of said interconnect opening and substantially only toward a center of said bottom wall of said interconnect opening and such that said alloy material is substantially not deposited on any bottom corner of said interconnect opening, wherein said step D of non-conformally depositing said alloy material is performed with a PVD physical vapor deposition) process, and wherein said alloy material is one of copper tin or copper zirconium;

E. filling said interconnect opening with copper by growing copper from any exposed surface of said seed layer to form a conductive fill of copper within said interconnect opening;

F. heating said semiconductor wafer by performing a first thermal anneal at a relatively low temperature in a range of from about 100° Celsius to about 250° Celsius for a time period in a range of from about 10 minutes to about 1 hour;

G. polishing said semiconductor wafer such that said alloy material and said conductive fill are contained within said interconnect opening;

wherein said alloy material toward said top of said sidewalls of said interconnect opening is exposed after polishing said semiconductor wafer;

H. heating said semiconductor wafer by performing a second thermal anneal at a relatively high temperature above about 250° Celsius for a time period in a range of from about 10 minutes to about 1 hour after said step of polishing said semiconductor wafer;

wherein said conductive fill forms into a substantially single grain structure, and wherein said seed layer of said conductive material incorporates into said substantially single grain structure of said conductive fill;

and wherein a reactant within said alloy material migrates along a top surface of said conductive fill and along a grain boundary of said conductive fill when said semiconductor wafer is heated;

I. forming an alloy precipitate from a reaction between said reactant and said conductive material on said top surface and at said grain boundary of said conductive fill when said semiconductor wafer is cooled down to room temperature after said step H; and J. depositing a capping layer over said interconnect opening, wherein said capping layer is comprised of silicon nitride (SiN);

and wherein said alloy precipitate on said top surface and at said grain boundary of said conductive fill prevents drift of said conductive material along said top surface and said grain boundary of said conductive fill and into said insulating layer surrounding said interconnect opening;

and wherein said alloy precipitate on said top surface of said conductive fill prevents drift of said conductive material from said conductive fill along a bottom surface of said capping layer and into said insulating layer surrounding said interconnect opening.

* * * * *